(12) United States Patent
Park et al.

(10) Patent No.: US 8,486,753 B2
(45) Date of Patent: Jul. 16, 2013

(54) PATTERNING METHOD OF METAL OXIDE THIN FILM USING NANOIMPRINTING, AND MANUFACTURING METHOD OF LIGHT EMITTING DIODE

(75) Inventors: Hyeong Ho Park, Daejeon (KR); Jun Ho Jeong, Daejeon (KR); Ki Don Kim, Seoul (KR); Dae Geun Choi, Daejeon (KR); Jun Hyuk Choi, Daejeon (KR); Ji Hye Lee, Daejeon (KR); Soon Won Lee, Daejeon (KR)

(73) Assignee: Korea Institute of Machinery and Materials, Daejeon (KR)

( * ) Notice: Subject to any disclaimer, the term of this patent is extended or adjusted under 35 U.S.C. 154(b) by 560 days.

(21) Appl. No.: 12/698,194

(22) Filed: Feb. 2, 2010

(65) Prior Publication Data
US 2011/0169027 A1 Jul. 14, 2011

(30) Foreign Application Priority Data
Jan. 13, 2010 (KR) .......................... 10-2010-0003109

(51) Int. Cl.
*H01L 21/00* (2006.01)

(52) U.S. Cl.
USPC .... 438/104; 438/500; 438/502; 257/E21.464; 257/E21.471; 257/E21.497

(58) Field of Classification Search
USPC ................. 257/49, 64, 65, 98, 103, E21.464, 257/E21.471, E21.497; 438/104, 500, 502
See application file for complete search history.

(56) References Cited

U.S. PATENT DOCUMENTS

| 7,691,294 B2 | 4/2010 | Chung et al. |
| 7,994,053 B2 * | 8/2011 | Park et al. ..................... 438/669 |
| 2005/0186515 A1 | 8/2005 | Watkins |
| 2009/0090273 A1 | 4/2009 | Heo et al. |
| 2010/0189901 A1 | 7/2010 | Chung et al. |
| 2011/0011148 A1 * | 1/2011 | Chen et al. ..................... 72/352 |

FOREIGN PATENT DOCUMENTS

| JP | 2006168147 A | 6/2006 |
| JP | 2007080455 A | 3/2007 |
| JP | 2008010763 A | 1/2008 |
| JP | 2008103600 A | 5/2008 |
| JP | 2009170447 A | 7/2009 |
| JP | 2010080977 A | 4/2010 |
| JP | 2010087069 A | 4/2010 |
| JP | 2011051875 A | 3/2011 |
| JP | 2011096706 A | 5/2011 |
| KR | 1020060067875 | 6/2006 |
| KR | 1020070021876 | 2/2007 |
| KR | 20100003690 | 1/2010 |
| WO | WO 2005101466 A2 | 10/2005 |
| WO | WO 2005101466 A3 | 10/2005 |

* cited by examiner

*Primary Examiner* — Eduardo A Rodela
(74) *Attorney, Agent, or Firm* — Dority & Manning, P.A.

(57) ABSTRACT

Disclosed are a patterning method of a metal oxide thin film using nanoimprinting, and a manufacturing method of a light emitting diode (LED). The method for forming a metal oxide thin film pattern using nanoimprinting includes: coating a photosensitive metal-organic material precursor solution on a substrate; preparing a mold patterned to have a protrusion and depression structure; pressurizing the photosensitive metal-organic material precursor coating layer with the patterned mold; forming a cured metal oxide thin film pattern by heating the pressurized photosensitive metal-organic material precursor coating layer or by irradiating ultraviolet rays to the pressurized photosensitive metal-organic material precursor coating layer while being heated; and removing the patterned mold from the metal oxide thin film pattern, and selectively further includes annealing the metal oxide thin film pattern. Within this, there is provided a method for forming a metal dioxe thin film pattern using nano imprinting, which makes it possible to simplify the process for forming the pattern since the process of separately applying the ultraviolet resin to be used as the resist can be omitted, and forms a micro/nano composite pattern through a single imprint process.

31 Claims, 15 Drawing Sheets

PATTERNING METHOD OF METAL OXIDE THIN FILM USING NANOIMPRINTING, AND MANUFACTURING METHOD OF LIGHT EMITTING DIODE

CROSS-REFERENCE TO RELATED APPLICATION

This application claims priority to and the benefit of Korean Patent Application No. 10-2010-0003109 filed in the Korean Intellectual Property Office on Jan. 13, 2010, the entire contents of which are incorporated herein by reference.

BACKGROUND OF THE INVENTION (a) Field of the Invention

The present invention relates to a nanoimprint process, and more particularly, to a method for forming a metal oxide thin film pattern on a substrate using ultraviolet irradiation or thermal nanoimprinting, and a manufacturing method of a light emitting diode (LED) device using the same.

(b) Description of the Related Art

Nanoimprinting is a technology that proposes to realize nanoprocessing (1 to 100 nm) that is microprocessing, and involves transferring a pattern by applying pressure to a mold having a nanosize and that is applied with a photocurable resin or thermoplastic resin and irradiating ultraviolet rays to the mold or heating it to cure.

Using the nanoimprint technology can simplify manufacture of a nanostructure like stamping a seal while overcoming a miniaturization critical point in a photolithography scheme used in the current semiconductor process.

In addition, using the nanoimprint technology improves the current 100-nm class fine process to a 10-nm fine process, thereby promoting a technology of a next-generation semiconductor field. In particular, the nanoimprint technology is considered a technology for forming a circuit for a next-generation semiconductor and flat panel display.

The nanoimprint technology is classified into a thermal imprinting technology that uses an opaque silicon stamp and an UV imprinting technology that uses a scheme of curing a resin by transmitting ultraviolet rays through a transparent quartz stamp (or transparent quartz substrate upon using a silicon stamp), according to a curing scheme.

Among those, in the UV nanoimprint process, a master pattern is first manufactured on a transparent mold substrate through nanolithography equipment such as electron beam, etc. A prepolymer resin that is cured by ultraviolet rays is spin-coated (or dispensed) on the substrate, and then the manufactured master contacts the resin. At this time, the resin is filled in the pattern by a capillary force, thereby performing the pattern transfer. After the filling is completed, ultraviolet rays passing through the transparent substrate cure the polymer and the master mold is then removed. In order to implement smooth filling and a uniform pattern size upon imprinting, the master mold should not directly contact the substrate. At this time, the generated residual thickness is removed by physical etching, thereby making it possible to etch the substrate or lift the metal off through post-processing if necessary.

When forming and patterning the metal oxide thin film on the substrate, the pattern is formed on the ultraviolet resin (resist) with the nanoimprint and the patterned metal oxide thin film is then formed by the etching process, such that the process is complicated.

The above information disclosed in this Background section is only for enhancement of understanding of the background of the invention and therefore it may contain information that does not form the prior art that is already known in this country to a person of ordinary skill in the art.

SUMMARY OF THE INVENTION

Accordingly, the present invention is conceived to solve the forgoing problems, and an aspect of the present invention is to provide a method for forming a metal oxide thin film pattern by applying a photosensitive metal-organic material precursor solution on a substrate without a photosensitive prepolymer resin (resist), and directly patterning it in an ultraviolet or thermal nanoimprint scheme.

Another aspect of the present invention is to provide a metal oxide thin film pattern that is directly patterned according to a method for forming a metal thin film pattern using an imprint.

Still another aspect of the present invention is to provide a manufacturing method of an LED device that forms a photonic crystal layer according to a method for forming a metal oxide thin film using an imprint.

Yet another aspect of the present invention is to provide an LED device manufactured by the manufacturing method of the LED device that forms the photonic crystal layer.

An exemplary embodiment of the present invention provides a method for forming a metal oxide thin film pattern using nanoimprinting, including: coating a photosensitive metal-organic material precursor solution on a substrate; preparing a mold patterned to have a protrusion and depression structure; pressurizing the photosensitive metal-organic material precursor coating layer with the patterned mold; forming a cured metal oxide thin film pattern by heating the pressurized photosensitive metal-organic material precursor coating layer or by irradiating ultraviolet rays to the pressurized photosensitive metal-organic material precursor coating layer while being heated; and removing the patterned mold from the metal oxide thin film pattern.

In preparing the patterned mold, the protrusion and depression structure patterned on the mold may be formed to have different heights.

The method for forming a metal oxide thin film pattern using nanoimprinting may further include annealing the metal oxide thin film pattern after removing the mold.

In forming the metal oxide thin film pattern, a heating temperature may range from 30° to 350° C., and a heating time may range from 15 seconds to 2 hours.

In the forming the metal oxide thin film pattern, an ultravilolet ray irradiating time may range from 1 second to 10 hours.

Meanwhile, the photosensitive metal-organic material precursor solution may include the metal-organic material precursor composed by bonding an organic material ligand to the metal.

A metal element forming the metal-organic material precursor may include any one or more metals selected from a group consisting of lithium (Li), beryllium (Be), boron (B), sodium (Na), magnesium (Mg), aluminum (Al), silicon (Si), phosphorous (P), sulfur (S), potassium (K), calcium (Ca), scandium (Sc), titanium (Ti), vanadium (V), chromium (Cr), manganese (Mn), iron (Fe), cobalt (Co), nickel (Ni), copper (Cu), zinc (Zn), gallium (Ga), germanium (Ge), arsenic (As), selenium (Se), rubidium (Rb), strontium (Sr), zirconium (Zr), niobium (Nb), molybdenum (Mo), ruthenium (Ru), rhodium (Rh), indium (In), tin (Sn), antimony (Sb), barium (Ba), lanthanum (La), cerium (Ce), praseodymium (Pr), neodymium (Nd), promethium (Pm), gadolinium (Gd), hafnium (Hf), tantalum (Ta), tungsten (W), iridium (Ir), lead (Pb), bismuth (Bi), polonium (Po), and uranium (U).

The organic material ligand may be selected from a group consisting of ethylhexanoate, acetylacetonate, dialkyldithiocarbamate, carboxylic acid, carboxylate, pyridine, diamine, arsine, diarsine, phosphine, diphosphine, butoxide, isopropoxide, ethoxide, chloride, acetate, carbonyl, carbonate, hydroxide, arena, beta-diketonate, and 2-nitrobenzaldehyde, and mixtures thereof.

The metal-organic material precursor may be dissolved in a solvent selected from a group consisting of hexanes, 4-methyl-2-pentanone, ketone, methyl isobutyl ketone, methyl ethyl ketone, water, methanol, ethanol, propanol, isopropanol, butanol, pentanol, hexanol, dimethyl sulfoxide (DMSO), dimethylformamide (DMF), N-methylpyrrolidone, acetone, acetonitrile, tetrahydrofuran (THF), tecan, nonane, octane, heptane, and pentane.

Another embodiment of the present invention provides a method for manufacturing an LED device having a photonic crystal structure using nanoimprinting, including: coating a photosensitive metal-organic material precursor solution on a layer, on which the photonic crystal structure is formed, on a substrate; preparing a mold patterned to have a protrusion and depression structure corresponding to the photonic crystal structure; pressurizing the photosensitive metal-organic material precursor coating layer with the patterned mold; forming a cured metal oxide thin film pattern by at least one of heating and irradiating ultraviolet rays to the pressurized photosensitive metal-organic material precursor coating layer; and removing the patterned mold from the metal oxide thin film pattern.

In coating the photosensitive metal-organic material precursor solution, a layer to form the photonic crystal structure may include a conductive layer of a transparent oxide electrode or metal.

The conductive layer may include a thickness of 1 nm to 200 nm, and if the conductive layer may include a transparent oxide electrode, the transparent oxide electrode may include one of ITO, ZnO, n-type ZnO, p-type ZnO and $SnO_2$.

If the n-type ZnO is used as a material for the transparent oxide electrode, an n-doping material may include one of aluminum (Al), boron (B), gallium (Ga), indium (In), scandium (Sc) and yttrium (Y). On the other hand, if the p-type ZnO is used as a material for the transparent oxide electrode, a p-doping material may include one of nitrogen (N), arsenic (As), phosphorus (P), lithium (Li), sodium (Na) and kalium (K).

If the conductive layer includes metal, the metal may include one of silver (Ag), gold (Au), platinum (Pt), copper (Cu), and aluminum (Al).

A metal layer may be further formed on a bottom of the conductive layer. At this time, the metal layer may include a thickness of 1 nm to 200 nm.

According to an exemplary embodiment of the present invention, there is provided a method for forming the metal oxide thin film pattern using the nanoimprinting, which makes it possible to simplify the process for forming the pattern since the process of separately applying the ultraviolet resin to be used as the resist can be omitted.

Also, there is provided a method for forming the metal oxide thin film pattern using the nanoimprinting, which can form a micro-/nano-composite pattern through a single imprint process.

Further, there is provided a method for forming the metal oxide thin film pattern using the nanoimprinting, a simplified process of which can be applied to various fields, such as a semiconductor, a display, a solar cell, a light emitting diode (LED), an organic light emitting diode (OLED), etc., that needs the metal oxide thin film pattern.

DETAILED DESCRIPTION OF THE EMBODIMENTS

Figure 1:
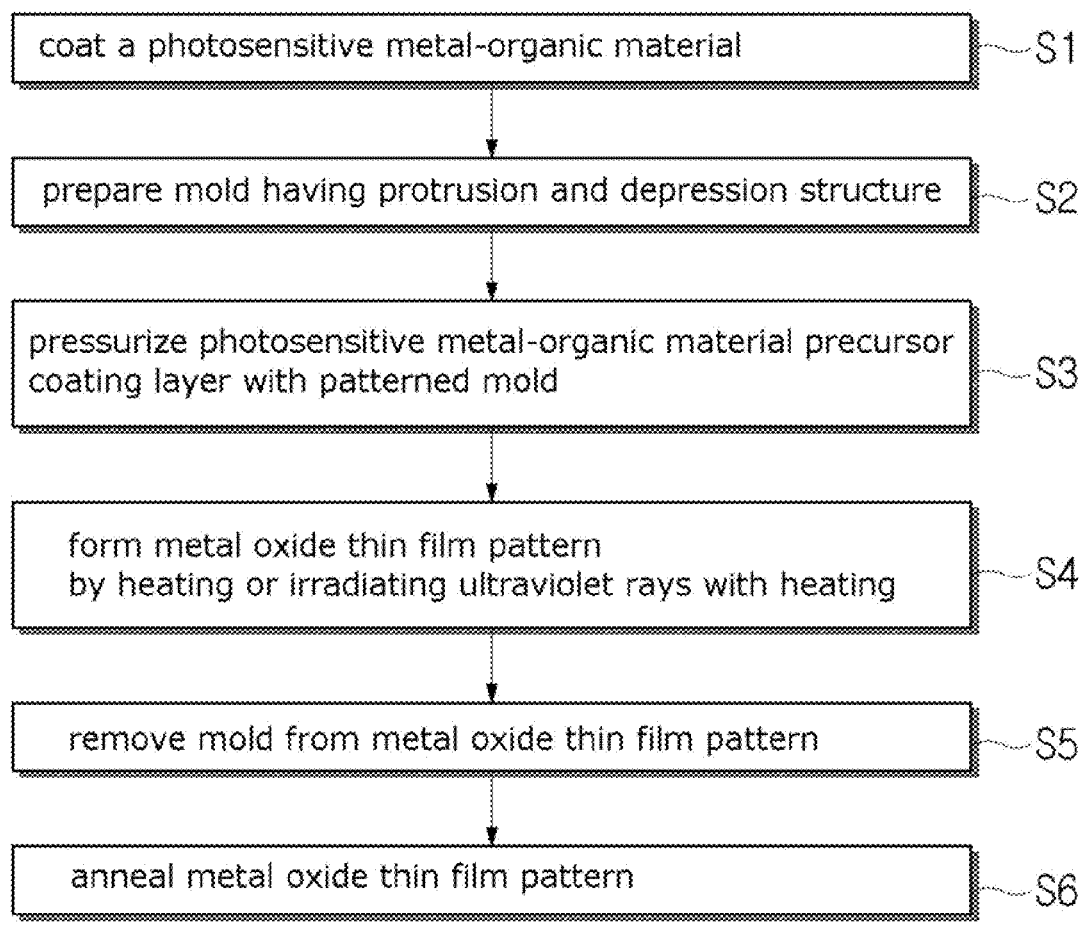
FIG. 1 is a flowchart showing a method for forming a metal oxide thin film pattern using nanoimprinting according to an embodiment of the present invention.

Prior to description, elements will be representatively explained in an embodiment and only different configurations will be described in another embodiment, in which like reference numerals refer to like elements throughout the embodiments.

Hereinafter, a method for forming a metal oxide thin film pattern using nanoimprinting according to an embodiment of the present invention will be described with reference to the accompanying drawings.

Figure 2:
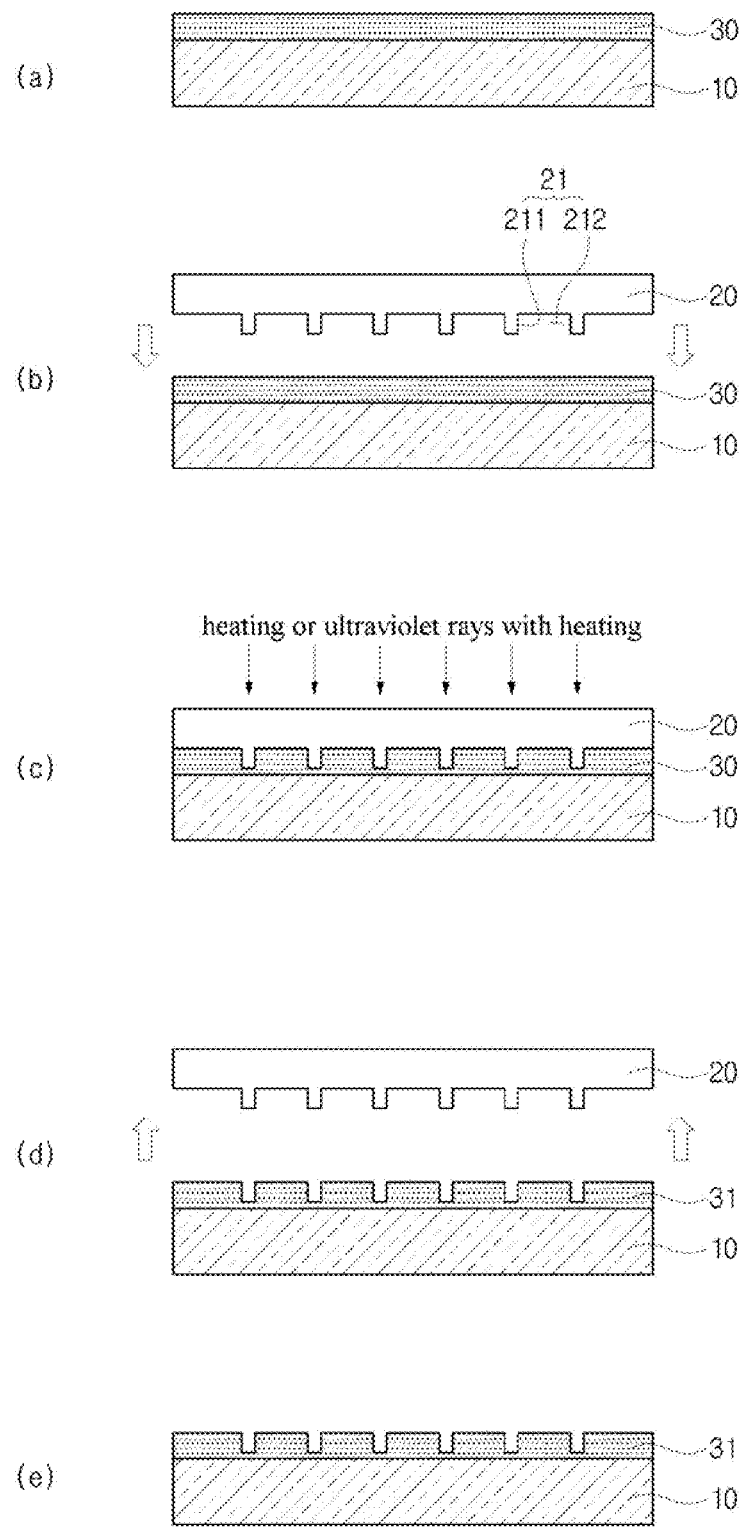
FIG. 2 is a process diagram showing the method for forming the metal oxide thin film pattern using the nanoimprinting according to an embodiment of the present invention.

FIG. 1 is a flowchart showing a method for forming a metal oxide thin film pattern using nanoimprinting according to an embodiment of the present invention, and FIG. 2 is a process diagram thereof.

A method for forming a metal oxide thin film pattern using an imprint will be described with reference to FIGS. 1 and 2.

First, as shown in (a) of FIG. 2, a substrate is prepared and a coating layer 30 of a photosensitive metal-organic material precursor solution is formed by coating the photosensitive metal-organic material precursor solution on a substrate 10 (S1).

The substrate 10 may be made of inorganic materials such as silicon, gallium arsenic, gallium phosphorous, gallium arsenic phosphorous, silicon oxide, sapphire, quartz, a glass substrate, and a transparent polymer such as polycarbonate, polyethylene naphthalate, polynoromene, polyacrylate, polyvinylalcohol, polyimide, polyethylene terephthalate, and polyethersulphone.

In order to prepare the photosensitive metal-organic material precursor solution, the metal-organic material precursor is first composed by bonding an organic material ligand to a metal element.

The metal element consisting of the metal-organic material precursor may include any one or more metals selected from a group consisting of lithium (Li), beryllium (Be), boron (B), sodium (Na), magnesium (Mg), aluminum (Al), silicon (Si), phosphorous (P), sulfur (S), potassium (K), calcium (Ca), scandium (Sc), titanium (Ti), vanadium (V), chromium (Cr), manganese (Mn), iron (Fe), cobalt (Co), nickel (Ni), copper (Cu), zinc (Zn), gallium (Ga), germanium (Ge), arsenic (As), selenium (Se), rubidium (Rb), strontium (Sr), zirconium (Zr), niobium (Nb), molybdenum (Mo), ruthenium (Ru), rhodium (Rh), indium (In), tin (Sn), antimony (Sb), barium (Ba), lanthanum (La), cerium (Ce), praseodymium (Pr), neodymium (Nd), promethium (Pm), gadolinium (Gd), hafnium (Hf), tantalum (Ta), tungsten (W), iridium (Ir), lead (Pb), bismuth (Bi), polonium (Po), and uranium (U). These metals may commonly form the metal oxide thin film when the metal-organic precursor is exposed to ultraviolet rays.

The metal-organic material precursor includes about 5 to 95 wt % of the organic material ligand and a metal element added to make a total amount reach 100 wt %, and the metal element bonds to the organic material ligand to prepare the metal-organic material precursor. The metal-organic material precursor is dissolved in a solvent to prepare a photosensitive metal-organic precursor solution. At this time, the solvent may be included at about 5 to 95 wt % with respect to a total amount of the photosensitive metal-organic material precursor solution.

The organic material ligand is selected from a group consisting of ethylhexanoate, acetylacetonate, dialkyldithiocarbamate, carboxylic acid, carboxylate, pyridine, diamine, arsine, diarsine, phosphine, diphosphine, butoxide, isopropoxide, ethoxide, chloride, acetate, carbonyl, carbonate, hydroxide, arena, beta-diketonate, 2-nitrobenzaldehyde, and mixtures thereof.

The solvent may be one selected from a group consisting of hexanes, 4-methyl-2-pentanone, ketone, methyl isobutyl ketone, methyl ethyl ketone, water, methanol, ethanol, propanol, isopropanol, butanol, pentanol, hexanol, dimethyl sulfoxide (DMSO), dimethylformamide (DMF), acetone, and tetrahydrofuran (THF).

In the metal-organic material precursor prepared as described above, the organic material can be decomposed by ultraviolet rays.

The photosensitive metal-organic material precursor solution can be coated on the substrate by using any one of spin coating, dip coating, spray coating, and solution dropping methods.

The solution coated by the method forms a photosensitive metal-organic material precursor coating layer 30 on the substrate 10. The photosensitive metal-organic material precursor coating layer 30 may be heated and dried to remove residual solvent.

Next, as shown in (b) of FIG. 2, a mold 20 that is patterned to have a protrusion and depression structure is prepared (S2), and the photosensitive metal-organic material precursor coating layer 30 is pressurized by the mold 20 (S3).

The mold 20 has a pattern 21 of protrusion and depressions on the bottom thereof, which is opposite to a pattern to be formed on the substrate 10. In other words, an embossed part 211 of the protrusion and depression structure 21 is patterned as an engraved part on the metal thin film on the substrate and the engraved part of the protrusion and depression structure 21 is patterned as an embossed part on the metal thin film on the substrate.

The mold 20 may be made of silicon (Si), quartz, or a polymer. For example, a polydimethylsiloxane (PDMS) mold, a polyurethane acrylate (PUA) mold, a polytetrafluoroethylene (PTFE) mold, an ethylene tetrafluoroethylene (ETFE) mold, or a perfluoroalkyl acrylate (PFA) mold may be used.

When the mold 20 is pressurized on the photosensitive metal-organic material precursor solution layer 30, this may be at a pressure of 0 to 100 bar, or under vacuum.

Next, a cured metal thin film pattern 31 is formed as shown in (d) of FIG. 2, by heating the photosensitive metal-organic material precursor solution coating layer 30 pressurized with the mold 20 or by irradiating ultraviolet rays on the pressurized photosensitive metal-organic material precursor solution coating layer 30 while being heated (S4).

Here, the mold 20 may be made of a transparent material to irradiate the ultraviolet rays while being heated. On the other hand, the mold 20 may be made of an opaque material if only heated.

When the pressurized photosensitive metal-organic material precursor solution coating layer 30 is heated, a predetermined heating means such as a heater or the like is used to heat the pressurized photosensitive metal-organic material precursor solution coating layer 30 at a temperature of 30° to 350° C. Here, a heating time may be adjusted within a range from 15 seconds to 2 hours.

As the pressurized photosensitive metal-organic material precursor solution coating layer 30 is heated, the organic materials attached to the metal are subjected to a pyrolysis reaction, and thus only the metals remain and are bonded with oxygen in the air, thereby forming a metal oxide thin film pattern 31.

At this time, to make an oxygen ambient while forming the metal oxide thin film pattern 31, the oxygen ambient is formed in a predetermined chamber and then the metal oxide thin film pattern 31 is heated by a predetermined heating means.

Meanwhile, in the case that the pressurized photosensitive metal-organic material precursor solution coating layer 30 is heated and exposed to ultraviolet rays, a laser exposure apparatus configured of KrF (248 nm), ArF (193 nm), and $F_2$ (157 nm), or a lamp exposure apparatus configured of G-line (436 nm) and I-line (365 nm), can be used as an exposure apparatus for irradiating the ultraviolet rays.

The ultraviolet ray irradiating time can be adjusted within a range from 1 second to 10 hours, and the ultraviolet ray irradiation can be performed at room temperature.

When ultraviolet rays are irradiated on the photosensitive metal-organic material precursor solution coating layer 30 that is coated on the substrate 10, the organic materials attached to the metal are subjected to a photolysis reaction, and thus only the metals remain and are bonded with oxygen in the air, thereby forming a metal oxide thin film pattern 35.

Thus, it is possible to reduce a processing time of forming the metal oxide thin film pattern by heating and irradiating the ultraviolet rays at the same time.

Next, the patterned mold 20 is removed from the metal oxide thin film pattern 35 (S5).

When the mold 20 is released and removed from the metal oxide thin film pattern 35, the substrate 10 on which the upper portion of the metal oxide thin film pattern 35 is formed is obtained as shown in (e) of FIG. 2.

Then, the height of the metal oxide thin film pattern patterned on the substrate and the thickness and refractive index of the remaining layer can be controlled by performing an annealing process in which heat treats the metal oxide thin film (S6). In other words, the patterned height and thickness and the refractive index of the remaining layer can be controlled by controlling the annealing time and temperature. The annealing step can be selectively adopted.

Further, a dry-etching process may further be performed after the annealing process, thereby completely removing the remaining layer.

Below, exemplary application of the foregoing embodiment will be described.

Figure 3:
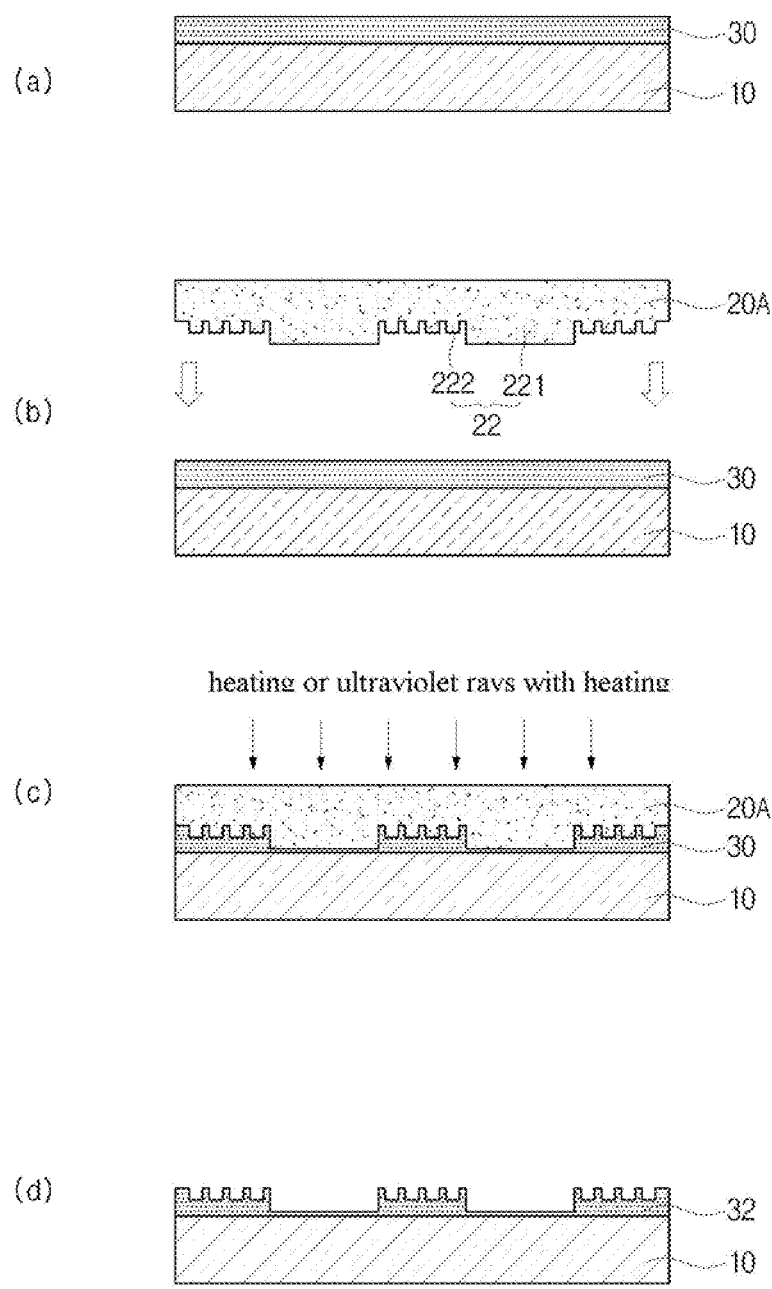
FIG. 3 is a process diagram showing a method for forming a micro-/nano-composite pattern according to exemplary application of the embodiment of the present invention.

FIG. 3 is a process diagram showing a method for forming a micro-/nano-composite pattern according to exemplary application of the embodiment of the present invention.

First, as shown in (a) of FIG. 3, a substrate is prepared and a coating layer 30 of a photosensitive metal-organic material precursor solution is formed by coating the photosensitive metal-organic material precursor solution on a substrate 10.

Then, as shown in (b) of FIG. 3, a mold 20A that is patterned to have a protrusion and depression structure is prepared, and the photosensitive metal-organic material precursor coating layer 30 is pressurized by the mold 20A.

To form a first pattern and a second pattern at once through a single process when the photosensitive metal-organic material precursor coating layer 30 formed on the substrate 10 is pressurized, the protrusion and depression structure 22 formed on the bottom of the mold 20A is prepared in the form of a complex.

At this time, the protrusion and depression structure 22 includes the first pattern 221 of a microscale and the second pattern 222 of a nano scale as opposed to the foregoing embodiment, in which the first pattern 221 and the second pattern 222 are formed to have different height from each other.

After the photosensitive metal-organic material precursor coating layer 30 is pressurized with the prepared mold 20A is as shown in (C) of FIG. 3, the pressurized photosensitive metal-organic material precursor coating layer 30 is cured by one of heating or irradiation of ultraviolet rays and then the mold 20A is removed.

At this time, conditions of heating or irradiation of ultraviolet rays may be properly modified within the scope of the foregoing embodiment.

The next processes may be the same as the foregoing embodiment, and consequently the micro/nano composite metal oxide patterns 32 can be, as shown in (d) of FIG. 3, formed on the substrate 10 at once through the single process of pressurizing the coating layer 30.

Figure 4:
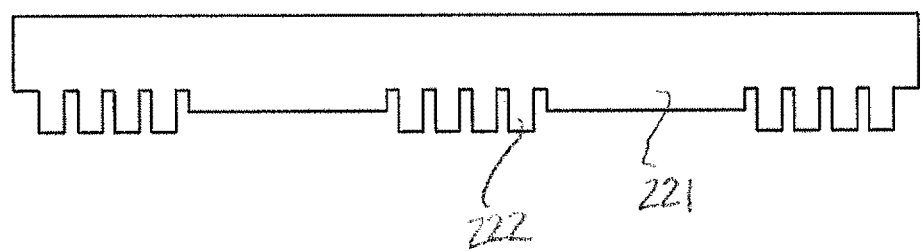
FIGS. 4 and 5 are cross-sectional views of a mold used in modified examples of the application of FIG. 3.
Figure 5:
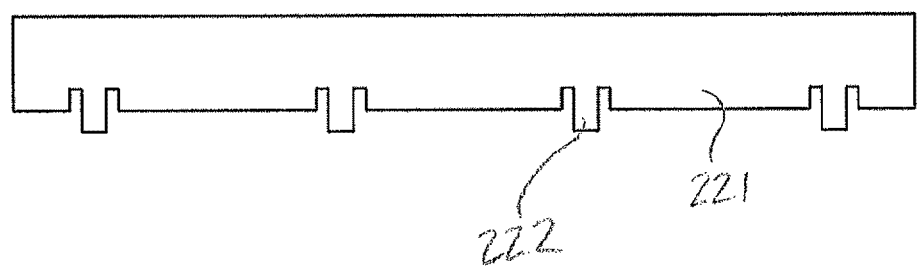

FIGS. 4 and 5 are modified examples of a mold applicable to the foregoing application.

FIG. 4 shows that the first pattern 221 of a microscale is higher than the second pattern 222 of a nanoscale.

FIG. 5 shows that the first pattern 221 of a microscale is lower than the second pattern 222 of a nanoscale, in which the shape of the second pattern 222 is changed.

As described above, various micro/nano composite patterned molds are prepared to form various micro/nano composite metal oxide patterns.

The method for forming a metal oxide thin film as described above can be applied to forming a photonic crystal structure of a light emitting diode (LED) device.

The photonic crystal is a lattice structure in which two or more dielectric materials having difference refractive indexes are infinitively repeated in a periodic structure of a nanoscale.

At this time, an inhibition band, in which a wavelength of light cannot propagate a medium, is shown, which is referred to a photonic bandgap.

In other words, the photonic crystal forms and controls the photonic bandgap by using the periodic refractive difference to convert the inner reflective path of light, thereby making it possible to maximize the light extracting efficiency of the LED device.

Figure 6:
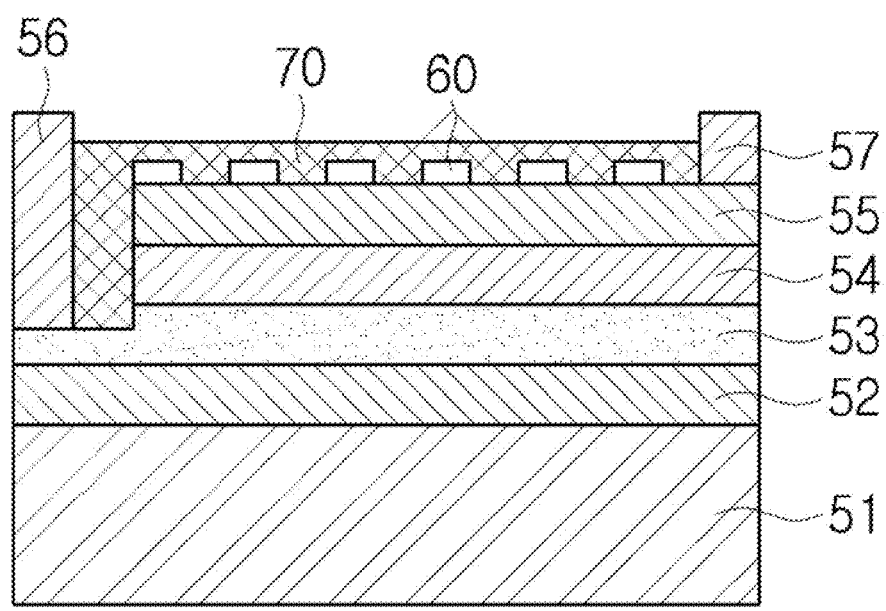
FIG. 6 is a cross-sectional view showing the LED device including a photonic crystal layer manufactured according to the method for forming the metal oxide thin film pattern according to another embodiment of the present invention.

FIG. 6 is a cross-sectional view showing the LED device including a photonic crystal layer manufactured according to the method for forming the metal oxide thin film pattern according to yet another embodiment of the present invention.

Referring to FIG. 6, an LED device 50 is configured such that a GaN buffer layer 52 is formed on a substrate 51, an n-type GaN layer 53, a light emitting layer 54, a p-type GaN layer 55 and a photonic crystal layer 60 are sequentially formed on the GaN buffer layer 52, the n-type GaN layer 53 and the photonic crystal layer 60 are etched to be partially exposed, and an n-type electrode 56 and a p-type electrode 57 are formed by wire bonding.

Then, a passivation layer 70 of silicon oxide ($SiO_2$) or the like material is formed to expose the n-type electrode 56 and the p-type electrode 57 to the outside, thereby completing the structure of the LED device 50.

In order to manufacture the photonic crystal layer 60, the photosensitive metal-organic material precursor solution is prepared, and the photosensitive metal-organic material precursor solution is coated on the p-type GaN layer 55. Then, the photosensitive metal-organic material precursor solution coating layer is pressurized by the patterned mold having the protrusion and depression structure.

At this time, the mold may be patterned to have the protrusion and depression structure that corresponds to the previously designed photonic crystal structure, and may be formed to have various micro/nano composite structures described in the foregoing application and modified examples.

The cured metal oxide thin film pattern is formed by at least one of heating or irradiating ultraviolet rays on the pressurized photosensitive metal-organic material precursor solution coating layer, and the mold is then removed, thereby forming the photonic crystal layer 60.

The conditions of heating or irradiating the ultraviolet rays may be the same as those of the foregoing embodiment and application.

As compared with a conventional one, the light extraction efficiency of the LED device 50 is improved since difference in the index of refraction between the p-type GaN layer 55 and the passivation layer 70 can be decreased by directly patterning the metal oxide thin film through the nanoimprinting process according to the present embodiment.

Further, the material used in forming the photonic crystal layer 60 may include $TiO_2$, $ZnO$, $ZrO_2$, $Y_2O_3$ and $SrO$ which have high indexes of refraction, and may use GaN/GaAs/GaP used as the substrate of the LED device 50.

Figure 7:
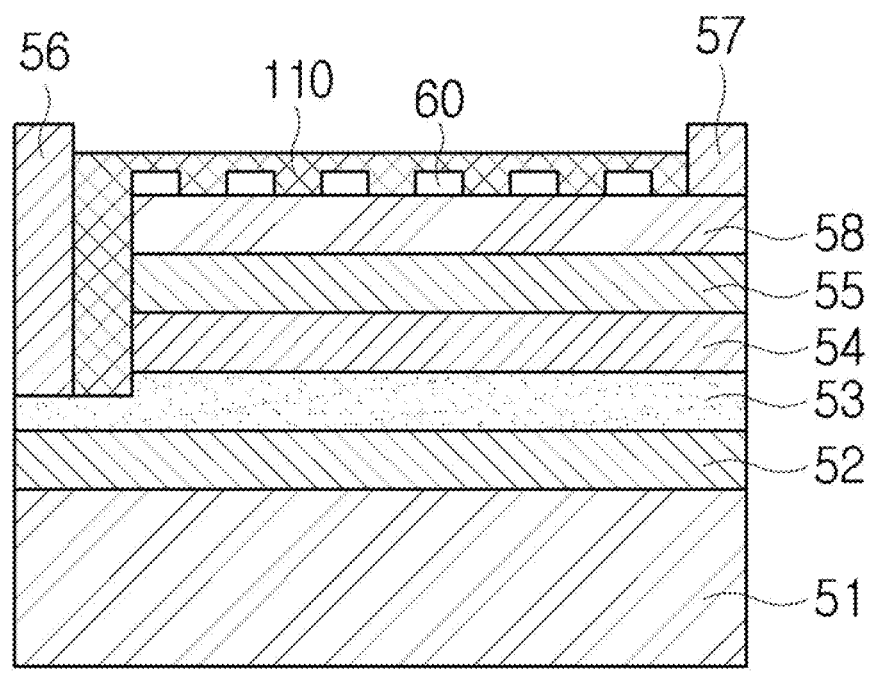
FIG. 7 is a cross-sectional view showing the LED device including a photonic crystal layer manufactured according to the method for forming the metal oxide thin film pattern according to first application of another embodiment of the present invention.

FIG. 7 is a cross-sectional view showing the LED device including a photonic crystal layer manufactured according to the method for forming the metal oxide thin film pattern according to first application of another embodiment of the present invention.

Referring to FIG. 7, as compared with the foregoing other embodiments, the structure of an LED device 50A according to the first application additionally includes a conductive layer 58 on the p-type GaN layer 55, i.e., between the p-type GaN layer 55 and the photonic crystal layer 60.

Here, the conductive layer 58 may be made of a transparent oxide electrode or metal, and have a thickness of about 1 nm to 200 nm.

When the conductive layer 58 is the transparent oxide electrode, the transparent oxide electrode may be one of ITO, ZnO, n-type ZnO, p-type ZnO and $SnO_2$ which are transparent materials.

If the n-type ZnO is used as a material for the transparent oxide electrode, an n-doping material may include one of aluminum (Al), boron (B), gallium (Ga), indium (In), scandium (Sc) and yttrium (Y).

If the p-type ZnO is used as a material for the transparent oxide electrode, a p-doping material may include one of nitrogen (N), arsenic (As), phosphorus (P), lithium (Li), sodium (Na) and kalium (K).

As the conductive layer 58 is formed, electric contact between the p-type GaN layer 55 and the p-electrode 57 can be enhanced, thereby improving the light extraction efficiency of the LED device 50A.

If the conductive layer 58 is made of metal, the metal may include one of silver (Ag), gold (Au), platinum (Pt), copper (Cu) and aluminum (Al).

After forming the conductive layer 58 as described above, the photonic crystal layer 60, the n-type electrode 56, the p-type electrode 57 and the passivation layer 70 are formed on the conductive layer 58 through the same following processes as the foregoing other embodiments, thereby completing the structure of the LED device 50A according to the first application.

Figure 8:
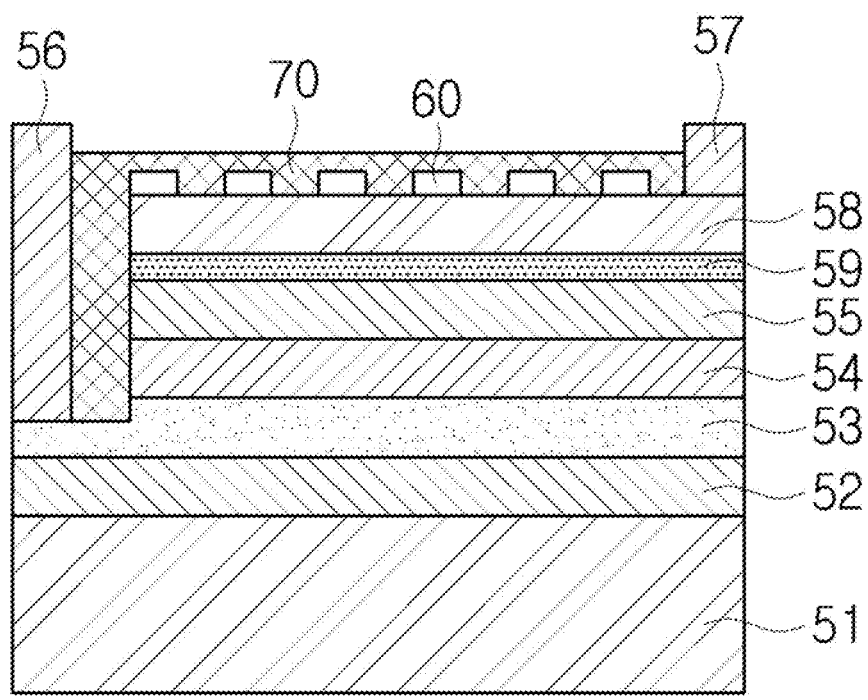
FIG. 8 is a cross-sectional view showing the LED device including a photonic crystal layer manufactured according to the method for forming the metal oxide thin film pattern according to second application of another embodiment of the present invention.

FIG. 8 is a cross-sectional view showing the LED device including a photonic crystal layer manufactured according to the method for forming the metal oxide thin film pattern according to second application of another embodiment of the present invention.

Referring to FIG. 8, as compared with the first application, the structure of an LED device 50B according to the second application additionally includes a metal layer 59 beneath the conductive layer 58, i.e., between the p-type GaN layer 55 and the conductive layer 58.

At this time, any metallic element on the periodic table can be used for the metal layer 59. For example, nickel (Ni) is preferable, and the metal layer 59 may have a thickness of 1 nm to 200 nm.

As the metal layer 59 is formed, electric contact between the p-type GaN layer 55 and the conductive layer 58 can be enhanced, thereby improving the light extraction efficiency of the LED device 50B.

After forming the metal layer 59, the conductive layer 58, the n-type electrode 56, the p-type electrode 57 and the passivation layer 70 are formed on the metal layer 59 through the same method as the first application, thereby completing the structure of the LED device 50B according to the second application.

Hereinafter, examples of the embodiments of the present invention will be described with reference to the accompanying drawings.

Example 1

In order to compose the photosensitive metal-organic material precursor solution of titanium (Ti), 1.0000 g of a Ti(VI)(n-butoxide)$_2$(2-ethylhexanoate)$_2$ composition and 5.000 g of hexanes (Aldrich Colo., U.S.A.) are injected and mixed and agitated for 24 hours, thereby preparing a $TiO_2$ sol of 0.27 molarity.

Herein, in order to compose Ti(VI)(n-butoxide)$_2$(2-ethylhexanoate)$_2$, 10.5266 g of Ti(VI)(n-butoxide)$_4$ (Aldrich Colo., U.S.A.), 8.7400 g of 2-ethylhexanoic acid (Aldrich Colo., U.S.A.), and 15.000 g of hexanes are put in a round flask and evaporated and condensed by a rotary evaporator for 72 hours, thereby composing the Ti(VI)(n-butoxide)$_2$(2-ethylhexanoate)$_2$.

The photosensitive metal-organic material precursor solution of the composed titanium is spin-coated on one side of the upper end of the silicon substrate under a condition of 3000 rpm, and then the mold, in which a pattern in a pillar or line shape is formed, is pressed.

Figure 9:
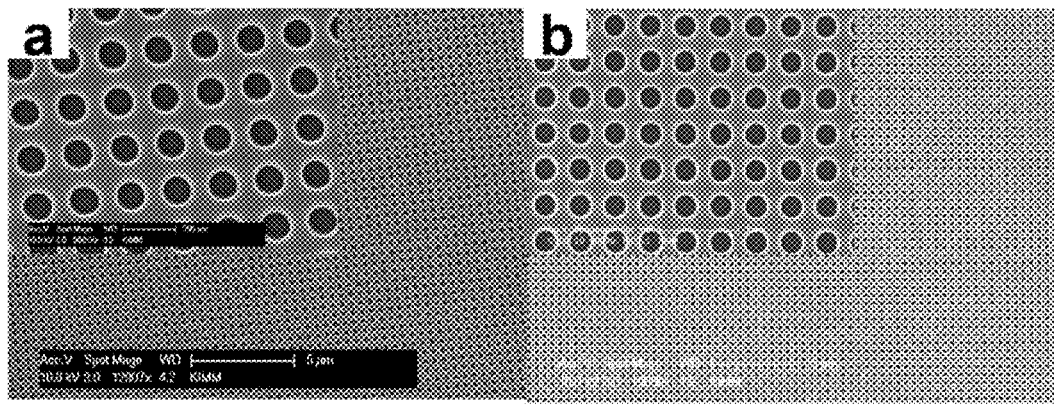
FIG. 9 is an SEM image of a direct pattern type titanium oxide ($TiO_2$) thin film formed according to example 1 of the present invention.

Ultraviolet rays were irradiated for 20 minutes or heating was performed for 7 minutes at a temperature of 150°, the mold is then released to form the titanium oxide thin film pattern, as shown in FIG. 9.

FIG. 9($a$) shows a pattern having a hole shape directly patterned by irradiating ultraviolet rays for 20 minutes, and FIG. 6($b$) shows a pattern having a hole shape patterned by heating for 7 minutes at a temperature of 150°.

As shown in FIG. 9, it is confirmed that the $TiO_2$ thin film patterned is formed by the ultraviolet or thermal nanoimprint process using the photosensitive metal-organic material precursor solution of titanium.

Example 2

In order to compose the photosensitive metal-organic material precursor solution of tin (Sn), 1.0000 g of Sn(II)2-ethylhexanoate (Alfa Aesar Colo., U.S.A.) and 6.000 g of hexanes (Aldrich Colo., U.S.A.) are injected and mixed and agitated for 24 hours, thereby preparing a $SnO_2$ sol of 0.21 molarity.

The photosensitive metal-organic material precursor solution of the composed tin (Sn) is spin-coated on one side of the upper end of the silicon substrate under a condition of 3000 rpm, and then the mold, in which the pattern in a pillar shape is formed, is pressed.

Figure 10:
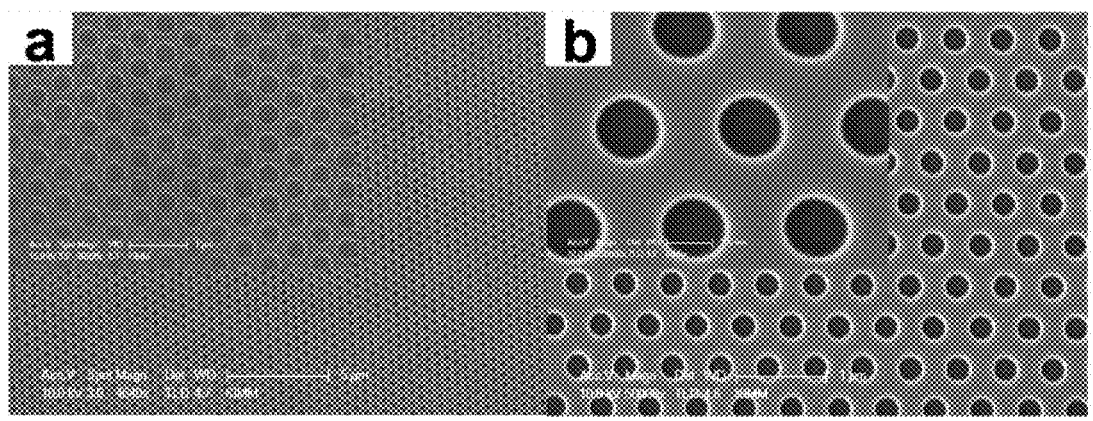
FIG. 10 is an SEM image of a direct pattern type tin oxide ($SnO_2$) thin film formed according to example 2 of the present invention.

FIG. 10($a$) shows a pattern formed by irradiating ultraviolet rays for 30 minutes, and FIG. 10($b$) shows a pattern formed by heating for 7 minutes at a to temperature of 150°. Thereafter, the mold is released to form the $SnO_2$ thin film pattern.

As shown in FIG. 10, it is confirmed that the $SnO_2$ thin film patterned by the ultraviolet or thermal nanoimprint process is formed by the nanoimprint process using the photosensitive metal-organic material precursor solution of tin (Sn).

Example 3

In order to compose the photosensitive metal-organic material precursor solution of various tins (Sn), 1.0000 g of Sn(II)2-ethylhexanoate (Alfa Aesar Colo., U.S.A.) and 6.000 g of MIBK(4-methyl-2-pentanone) (Aldrich Colo., U.S.A.) are injected and mixed and agitated for 24 hours, thereby preparing a $SnO_2$(II) sol of 0.25 molarity.

The photosensitive metal-organic material precursor solution (II) of the composed tin (Sn) is spin-coated on one side of the upper end of the silicon substrate under a condition of 3000 rpm, and then the mold, in which the pattern in a pillar shape is formed, is pressed.

FIG. 11(a) shows a pattern formed by irradiating ultraviolet rays for 30 minutes, and FIG. 11(b) shows a pattern formed by heating for 7 minutes at a temperature of 150°. Thereafter, the mold is released to form the $SnO_2$ thin film pattern.

Figure 11:
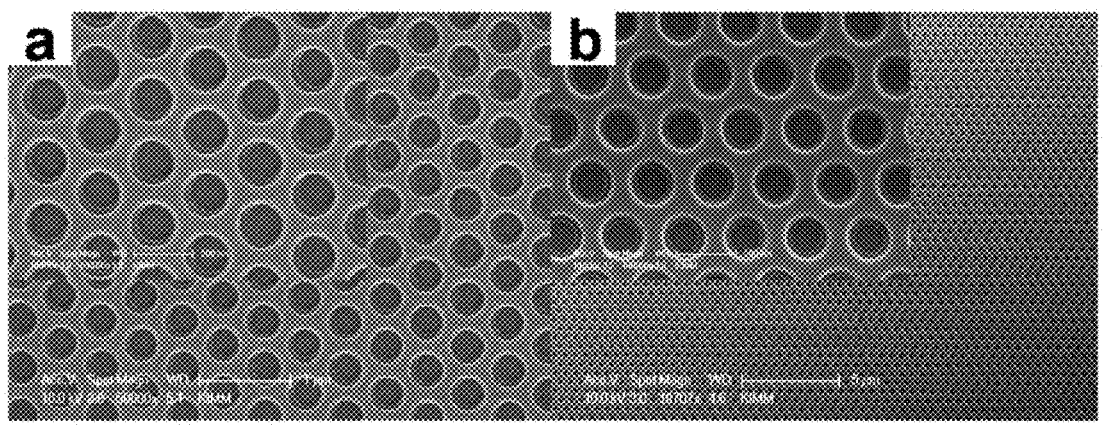
FIG. 11 is another SEM image direct pattern type tin oxide ($SnO_2$) thin film formed according to example 3 of the present invention.

As shown in FIG. 11, it is confirmed that the $SnO_2$ thin film patterned is formed by the ultraviolet or thermal nanoimprint process using the photosensitive metal-organic material precursor solution (II) of tin (Sn). In particular, in the case of the present example, in order to compose the metal-organic material precursor solution of tin (Sn), it is confirmed that the photosensitive metal-organic material precursor solution of various tins (Sn) is composed by being dissolved in various solvents.

Example 4

In order to compose the photosensitive metal-organic material precursor solution of zirconium, 1.6893 g of Zr(VI) 2-ethylhexanoate (Strem Colo., U.S.A.) and 10.6749 g of hexanes (Aldrich Colo., U.S.A.) are injected and mixed and agitated for 24 hours, thereby preparing a $ZrO_2$ sol of 0.063 molarity.

The photosensitive metal-organic material precursor solution of the composed zirconium is spin-coated on one side of the upper end of the silicon substrate under a condition of 3000 rpm, and then the mold, in which the pattern in a hole shape is formed, is pressed.

FIG. 12(a) shows a pattern formed by irradiating ultraviolet rays for 30 minutes, and FIG. 12(b) shows a pattern formed by heating for 7 minutes at a temperature of 150°. Thereafter, the mold is released to form the $ZrO_2$ thin film pattern.

Figure 12:
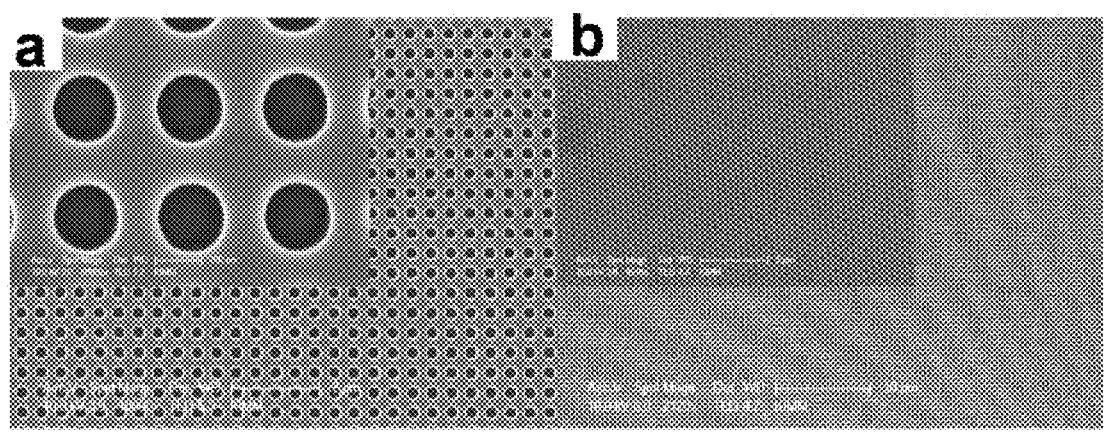
FIG. 12 is an SEM image of a direct pattern type zirconium oxide ($ZrO_2$) thin film formed according to example 4 of the present invention.

As shown in FIG. 12, it is confirmed that the $ZrO_2$ thin film patterned is formed by the ultravilolet or thermal nanoimprint process using the photosensitive metal-organic material precursor solution of zirconium.

Example 5

In order to form the micro/nano composite patterned $TiO_2$ thin film of which heights are partially different, the photosensitive metal-organic material precursor solution of titanium composed in Example 1 was spin-coated on the upper portion of the silicon substrate under a condition of 3000 rpm, and then the mold having a micro/nano composite protrusion and depression structure was bonded thereto.

FIG. 13(a) shows a pattern formed by irradiating ultraviolet rays for 30 minutes, and FIG. 13(b) shows a pattern formed by heating for 7 minutes at a temperature of 150°. Thereafter, the mold is released to form the micro/nano composite $TiO_2$ thin film pattern.

Figure 13:
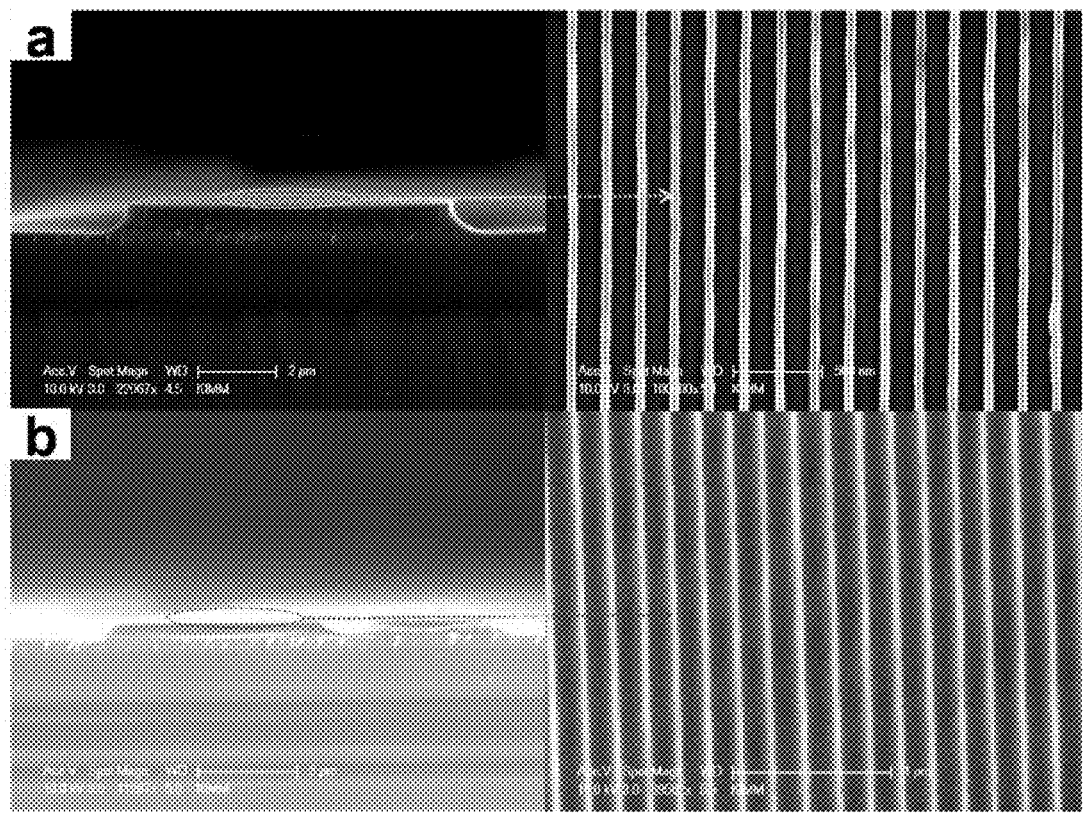
FIG. 13 is an SEM image of a complex patterned titanium oxide ($TiO_2$) thin film of a micro/nanoscale formed according to example 5 of the present invention.

As shown in FIG. 13, it is confirmed that the $TiO_2$ thin film of the micro/nano composite pattern with different heights is formed by the ultravilolet or thermal nanoimprint process using the mold having the micro/nano composite protrusion and depression structure with different heights.

Example 6

In order to apply the directly patterned $TiO_2$ thin film to the photonic crystal structure of the LED device, the photosensitive metal-organic material precursor solution of titanium composed in the example 1 is coated on one side of the upper end of a p-type GaN/MQW layer/n-type GaN/GaN buffer layer/sapphire substrate under a condition of 3000 rpm, and the mold, in which the pattern in a pillar shape is formed, is pressed.

Ultraviolet rays are irradiated for 20 minutes, and the mold is then released to form the titanium oxide thin film pattern having the photonic crystal structure.

As the photonic crystal structure, the following four types of samples were manufactured in order to confirm the pattern and the annealing effect of the $TiO_2$ thin film.

Example 6-1: patterned $TiO_2$ thin film
Example 6-2: $TiO_2$ thin film formed by annealing the patterned thin film for 1 hour at 400° C.
Comparative Example 1: non-patterned $TiO_2$ thin film
Comparative Example 2: $TiO_2$ thin film formed by annealing the non-patterned thin film for 1 hour at 400° C.

Figure 14:
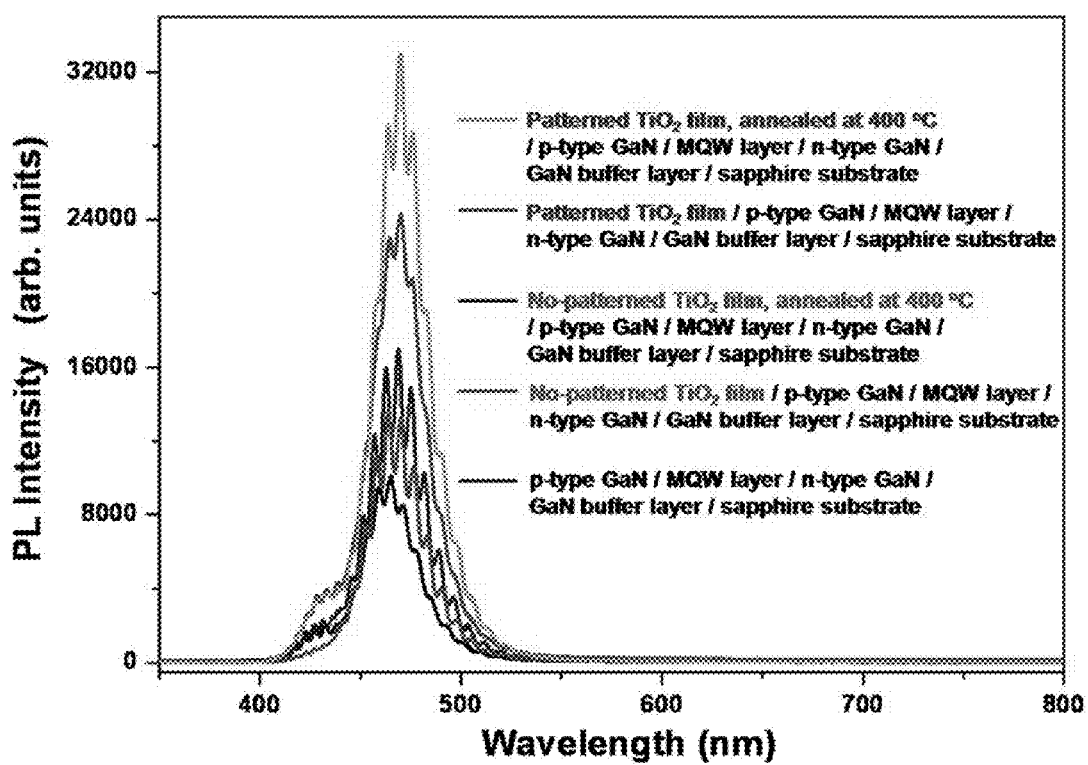
FIG. 14 is a graph showing improved light emitting characteristics of a photonic crystal layer titanium oxide ($TiO_2$) thin film of an LED device formed according to example 6 of the present invention.

In order to confirm the light extraction efficiency of the respective manufactured LED devices, they were analyzed using PL (photoluminescence, He—Cd Laser) (OmniChrome Colo., U.S.A.) and the results are shown in FIG. 14.

As shown in FIG. 14, when the PL intensity of the p-type GaN/MQW layer/n-type GaN/GaN buffer layer/sapphire substrate was considered to be 100%, in the case of the non-patterned $TiO_2$ thin film (Comparative Example 1), it is improved by 33%, in the case of the $TiO_2$ thin film (Comparative Example 2) formed by annealing the non-patterned thin film for 1 hour at 400° C., it is improved by 67%, in the case of the patterned $TiO_2$ thin film (Example 6-1), it is improved by 139%, and in the case of the $TiO_2$ thin film (Example 6-2) formed by annealing the patterned thin film for 1 hour at 400° C., it is improved by 225%. In other words, as the photonic crystal layer, it is confirmed that the improvement of the light extraction efficiency is maximized by patterning and annealing the $TiO_2$ thin film.

Example 7

In order to apply the $TiO_2$ thin film directly patterned by the ultraviolet nanoimprint process or the $ZrO_2$ thin film directly patterned by the thermal nanoimprint process to the photonic crystal structure of the LED device, the photosensitive metal-organic material precursor solution of titanium or zirconium composed in the example 1 or 4 is coated on one side of the upper end of an ITO layer/p-type GaN/MQW layer/n-type GaN/GaN buffer layer/sapphire substrate under a condition of 3000 rpm, and the mold, in which the pattern in a pillar shape is formed, is pressed.

The directly patterned $TiO_2$ thin film was exposed to the ultravilolet rays for 20 minutes and the mold was then released, or the directly patterned $ZrO_2$ thin film was heated for 7 minutes at a temperature of 150° and the mold was then released, thereby forming the titanium oxide thin film pattern or the zirconium oxide thin film pattern having the photonic crystal layer.

As the photonic crystal structure on the ITO thin film, the following four types of samples were manufactured in order to confirm the pattern and the annealing effect of the $TiO_2$ and $ZrO_2$ thin film.

Example 7-1: $TiO_2$ thin film directly patterned by the ultraviolet nanoimprint process
Example 7-2: $TiO_2$ thin film by annealing the thin film, directly patterned by the ultraviolet nanoimprint process, for 1 hour at 400° C.
Example 7-3: $ZrO_2$ thin film directly patterned by the thermal nanoimprint process Example 7-4: ZrO₂ thin film by annealing the thin film, directly patterned by the thermal nanoimprint process, for 1 hour at 400° C.

Figure 15:
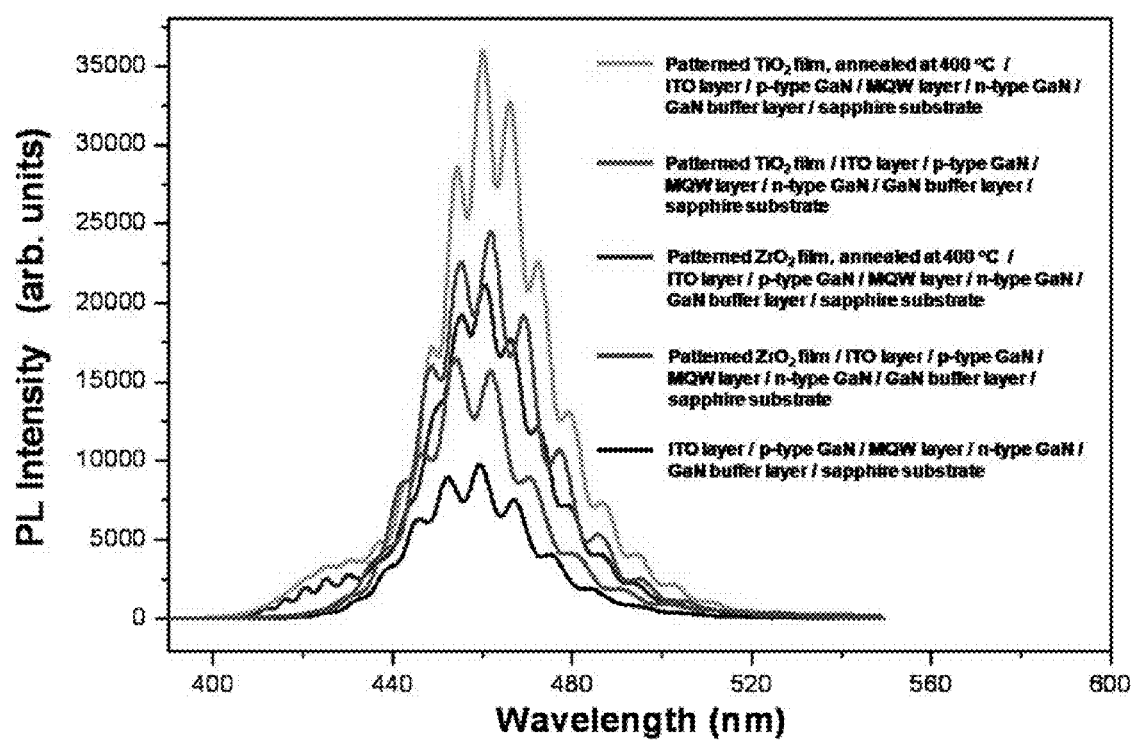
FIG. 15 is a graph showing improved light emitting characteristics of a photonic crystal layer titanium oxide ($TiO_2$) and zirconium oxide ($ZrO_2$) thin films of an LED device formed according to example 7 of the present invention.

In order to confirm the light extraction efficiency of the respective manufactured LED devices, they were analyzed using PL (photoluminescence, He—Cd Laser) (OmniChrome Colo., U.S.A.) and the results are shown in FIG. 15.

As shown in FIG. 15, when the PL intensity of the ITO layer/p-type GaN/MQW layer/n-type GaN/GaN buffer layer/sapphire substrate was considered to be 100%, in the case of the patterned TiO₂ thin film (Example 7-1), it is improved by 151%, and in the case of the TiO₂ thin film (Example 7-2) formed by annealing the patterned thin film for 1 hour at 400° C., it is improved by 269%.

In the case of the patterned ZrO₂ thin film (Example 7-3), it is improved by 69%, and in the case of the ZrO₂ thin film (Example 7-4) formed by annealing the patterned thin film for 1 hour at 400° C., it is improved by 116%.

In other words, as the photonic crystal layer on the ITO thin film, it is confirmed that the improvement of the light extraction efficiency is maximized by patterning and annealing the TiO₂ or ZrO₂ thin film.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for forming a metal oxide thin film pattern using nanoimprinting, comprising: coating a photosensitive metal-organic material precursor solution on a substrate; preparing a mold patterned to have a protrusion and depression structure; pressurizing the photosensitive metal-organic material precursor coating layer with the patterned mold; forming a cured metal oxide thin film pattern by irradiating ultraviolet rays to the pressurized photosensitive metal-organic material precursor coating layer while being heated; and removing the patterned mold from the metal oxide thin film pattern, wherein in the forming the metal oxide thin film pattern, a heating temperature ranges from 30° to 350° C., and a heating time ranges from 15 seconds to 2 hours.

2. The method for forming a metal oxide thin film pattern using nanoimprinting of claim 1, wherein in the preparing the patterned mold, the protrusion and depression structure patterned on the mold is formed to have different heights.

3. The method for forming a metal oxide thin film pattern using nanoimprinting of claim 1, further comprising annealing the metal oxide thin film pattern after the removing the mold.

4. The method for forming a metal oxide thin film pattern using nanoimprinting of claim 1, wherein in the forming the metal oxide thin film pattern, an ultraviolet ray irradiating time ranges from 1 second to 10 hours.

5. The method for forming a metal oxide thin film pattern using nanoimprinting of claim 1, wherein the photosensitive metal-organic material precursor solution comprises the metal-organic material precursor composed by bonding an organic material ligand to the metal.

6. The method for forming a metal oxide thin film pattern using nanoimprinting of claim 5, wherein a metal element forming the metal-organic material precursor comprises any one or more metals selected from a group consisting of lithium (Li), beryllium (Be), boron (B), sodium (Na), magnesium (Mg), aluminum (Al), silicon (Si), phosphorous (P), sulfur (S), potassium (K), calcium (Ca), scandium (Sc), titanium (Ti), vanadium (V), chromium (Cr), manganese (Mn), iron (Fe), cobalt (Co), nickel (Ni), copper (Cu), zinc (Zn), gallium (Ga), germanium (Ge), arsenic (As), selenium (Se), rubidium (Rb), strontium (Sr), zirconium (Zr), niobium (Nb), molybdenum (Mo), ruthenium (Ru), rhodium (Rh), indium (In), tin (Sn), antimony (Sb), barium (Ba), lanthanum (La), cerium (Ce), praseodymium (Pr), neodymium (Nd), promethium (Pm), gadolinium (Gd), hafnium (Hf), tantalum (Ta), tungsten (W), iridium (Ir), lead (Pb), bismuth (Bi), polonium (Po), and uranium (U).

7. The method for forming a metal oxide thin film pattern using nanoimprinting of claim 5, wherein the organic material ligand is selected from a group consisting of ethylhexanoate, acetylacetonate, dialkyldithiocarbamate, carboxylic acid, carboxylate, pyridine, diamine, arsine, diarsine, phosphine, diphosphine, butoxide, isopropoxide, ethoxide, chloride, acetate, carbonyl, carbonate, hydroxide, arena, beta-diketonate, and 2-nitrobenzaldehyde, and mixtures thereof.

8. The method for forming a metal oxide thin film pattern using nanoimprinting of claim 5, wherein the metal-organic material precursor is dissolved in a solvent selected from a group consisting of hexanes, 4-methyl-2-pentanone, ketone, methyl isobutyl ketone, methyl ethyl ketone, water, methanol, ethanol, propanol, isopropanol, butanol, pentanol, hexanol, dimethyl sulfoxide (DMSO), dimethylformamide (DMF), N-methylpyrrolidone, acetone, acetonitrile, tetrahydrofuran (THF), tecan, nonane, octane, heptane, and pentane.

9. A method for forming a metal oxide thin film pattern using nanoimprinting, comprising: coating a photosensitive metal-organic material precursor solution on a substrate; preparing a mold patterned to have a protrusion and depression structure; pressurizing the photosensitive metal-organic material precursor coating layer with the patterned mold; forming a cured metal oxide thin film pattern by one of heating and irradiating ultraviolet rays to the pressurized photosensitive metal-organic material precursor coating layer; and removing the patterned mold from the metal oxide thin film pattern, the protrusion and depression structure patterned on the mold being formed to have different heights, wherein in forming the metal oxide thin film pattern, a heating temperature ranges from 30° to 350° C., and a heating time ranges from 15 seconds to 2 hours.

10. The method for forming a metal oxide thin film pattern using nanoimprinting of claim 9, further comprising annealing the metal oxide thin film pattern after the removing the mold.

11. The method for forming a metal oxide thin film pattern using nanoimprinting of claim 9, wherein in the forming the metal oxide thin film pattern, an ultraviolet ray irradiating time ranges from 1 second to 10 hours.

12. The method for forming a metal oxide thin film pattern using nanoimprinting of claim 9, wherein the photosensitive metal-organic material precursor solution comprises the metal-organic material precursor composed by bonding an organic material ligand to the metal.

13. The method for forming a metal oxide thin film pattern using nanoimprinting of claim 12, wherein a metal element forming the metal-organic material precursor comprises any one or more metals selected from a group consisting of lithium (Li), beryllium (Be), boron (B), sodium (Na), magnesium (Mg), aluminum (Al), silicon (Si), phosphorous (P), sulfur (S), potassium (K), calcium (Ca), scandium (Sc), titanium (Ti), vanadium (V), chromium (Cr), manganese (Mn), iron (Fe), cobalt (Ca), nickel (Ni), copper (Cu), zinc (Zn), gallium (Ga), germanium (Ge), arsenic (As), selenium (Se), rubidium (Rb), strontium (Sr), zirconium (Zr), niobium (Nb), molybdenum (Mo), ruthenium (Ru), rhodium (Rh), indium (In), tin (Sn), antimony (Sb), barium (Ba), lanthanum (La), cerium (Ce), praseodymium (Pr), neodymium (Nd), promethium (Pm), gadolinium (Gd), hafnium (Hf), tantalum (Ta), tungsten (W), iridium (Ir), lead (Pb), bismuth (Bi), polonium (Po), and uranium (U).

14. The method for forming a metal oxide thin film pattern using nanoimprinting of claim 12, wherein the organic material ligand is selected from a group consisting of ethylhexanoate, acetylacetonate, dialkyldithiocarbamate, carboxylic acid, carboxylate, pyridine, diamine, arsine, diarsine, phosphine, diphosphine, butoxide, isopropoxide, ethoxide, chloride, acetate, carbonyl, carbonate, hydroxide, arena, beta-diketonate, and 2-nitrobenzaldehyde, and mixtures thereof.

15. The method for forming a metal oxide thin film pattern using nanoimprinting of claim 12, wherein the metal-organic material precursor is dissolved in a solvent selected from a group consisting of hexanes, 4-methyl-2-pentanone, ketone, methyl isobutyl ketone, methyl ethyl ketone, water, methanol, ethanol, propanol, isopropanol, butanol, pentanol, hexanol, dimethyl sulfoxide (DMSO), dimethylformamide (DMF), N-methylpyrrolidone, acetone, acetonitrile, tetrahydrofuran (THF), tecan, nonane, octane, heptane, and pentane.

16. A method for manufacturing an LED device having a photonic crystal structure using nanoimprinting, comprising: coating a photosensitive metal-organic material precursor solution on a layer, on which the photonic crystal structure is formed, on a substrate; preparing a mold patterned to have a protrusion and depression structure corresponding to the photonic crystal structure; pressurizing the photosensitive metal-organic material precursor coating layer with the patterned mold; forming a cured metal oxide thin film pattern by irradiating ultraviolet rays to the pressurized photosensitive metal-organic material precursor coating layer while being heated; and removing the patterned mold from the metal oxide thin film pattern, wherein in forming the metal oxide thin film pattern, a heating temperature ranges from 30° to 350° C., and a heating time ranges from 15 seconds to 2 hours.

17. The method for manufacturing an LED device using nanoimprinting of claim 16, wherein in the preparing the patterned mold, the protrusion and depression structure patterned on the mold is formed to have different heights.

18. The method for manufacturing an LED device using nanoimprinting of claim 16, further comprising annealing the metal oxide thin film pattern having the photonic crystal structure.

19. The method for manufacturing an LED device using nanoimprinting of claim 16, wherein in the forming the metal oxide thin film pattern, an ultraviolet ray irradiating time ranges from 1 second to 10 hours.

20. The method for manufacturing an LED device using nanoimprinting of claim 16, wherein in the coating the photosensitive metal-organic material precursor solution, a layer to form the photonic crystal structure comprises a conductive layer of a transparent oxide electrode or metal.

21. The method for manufacturing an LED device using nanoimprinting of claim 20, wherein the conductive layer comprises a thickness of 1 nm to 200 nm.

22. The method for manufacturing an LED device using nanoimprinting of claim 20, wherein, if the conductive layer comprises a transparent oxide electrode, the transparent oxide electrode comprises one of ITO, ZnO, n-type ZnO, p-type ZnO and $SnO_2$.

23. The method for manufacturing an LED device using nanoimprinting of claim 22, wherein, if the n-type ZnO is used as a material for the transparent oxide electrode, an n-doping material comprises one of aluminum (Al), boron (B), gallium (Ga), indium (In), scandium (Sc) and yttrium (Y).

24. The method for manufacturing an LED device using nanoimprinting of claim 22, wherein, if the p-type ZnO is used as a material for the transparent oxide electrode, a p-doping material comprises one of nitrogen (N), arsenic (As), phosphorus (P), lithium (Li), sodium (Na) and kalium (K).

25. The method for manufacturing an LED device using nanoimprinting of claim 20, wherein, if the conductive layer comprises metal, the metal comprises one of silver (Ag), gold (Au), platinum (Pt), copper (Cu), and aluminum (Al).

26. The method for manufacturing an LED device using nanoimprinting of claim 20, wherein a metal layer is further formed on a bottom of the conductive layer.

27. The method for manufacturing an LED device using nanoimprinting of claim 26, wherein the metal layer comprises a thickness of 1 nm to 200 nm.

28. The method for manufacturing an LED device using nanoimprinting of claim 16, wherein the photosensitive metal-organic material precursor solution comprises a metal-organic material precursor composed by bonding an organic material ligand to the metal.

29. The method for manufacturing an LED device using nanoimprinting of claim 28, wherein a metal element forming the metal-organic material precursor comprises any one or more metals selected from a group consisting of lithium (Li), beryllium (Be), boron (B), sodium (Na), magnesium (Mg), aluminum (Al), silicon (Si), phosphorous (P), sulfur (S), potassium (K), calcium (Ca), scandium (Sc), titanium (Ti), vanadium (V), chromium (Cr), manganese (Mn), iron (Fe), cobalt (Co), nickel (Ni), copper (Cu), zinc (Zn), gallium (Ga), germanium (Ge), arsenic (As), selenium (Se), rubidium (Rb), strontium (Sr), zirconium (Zr), niobium (Nb), molybdenum (Mo), ruthenium (Ru), rhodium (Rh), indium (In), tin (Sn), antimony (Sb), barium (Ba), lanthanum (La), cerium (Ce), praseodymium (Pr), neodymium (Nd), promethium (Pm), gadolinium (Gd), hafnium (HO, tantalum (Ta), tungsten (W), iridium (Ir), lead (Pb), bismuth (Bi), polonium (Po), and uranium (U).

30. The method for manufacturing an LED device using nanoimprinting of claim 28, wherein the organic material ligand is selected from a group consisting of ethylhexanoate, acetylacetonate, dialkyldithiocarbamate, carboxylic acid, carboxylate, pyridine, diamine, arsine, diarsine, phosphine, diphosphine, butoxide, isopropoxide, ethoxide, chloride, acetate, carbonyl, carbonate, hydroxide, arena, beta-diketonate, and 2-nitrobenzaldehyde, and mixtures thereof.

31. The method for manufacturing an LED device using nanoimprinting of claim 28, wherein the metal-organic material precursor is dissolved in a solvent selected from a group consisting of hexanes, 4-methyl-2-pentanone, ketone, methyl isobutyl ketone, methyl ethyl ketone, water, methanol, ethanol, propanol, isopropanol, butanol, pentanol, hexanol, dimethyl sulfoxide (DMSO), dimethylformamide (DMF), N-methylpyrrolidone, acetone, acetonitrile, tetrahydrofuran (THF), tecan, nonane, octane, heptane, and pentane.

* * * * *